United States Patent
Koziarz et al.

(10) Patent No.: US 10,536,177 B2
(45) Date of Patent: Jan. 14, 2020

(54) RADIO COMMUNICATION RECEIVER AND METHOD FOR CONFIGURING A NOTCH FILTER OF THE RADIO COMMUNICATION RECEIVER

(71) Applicant: Telefonaktiebolaget LM Ericsson (publ), Stockholm (SE)

(72) Inventors: Kazimierz Koziarz, Kista (SE); Erik Larsson, Uppsala (SE); Henrik Egnell, Uppsala (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 16/306,497

(22) PCT Filed: Jun. 15, 2016

(86) PCT No.: PCT/SE2016/050582
§ 371 (c)(1),
(2) Date: Nov. 30, 2018

(87) PCT Pub. No.: WO2017/217900
PCT Pub. Date: Dec. 21, 2017

(65) Prior Publication Data
US 2019/0158132 A1    May 23, 2019

(51) Int. Cl.
*H04B 1/10* (2006.01)
*H03H 17/02* (2006.01)
*H03H 17/06* (2006.01)

(52) U.S. Cl.
CPC ........ *H04B 1/1036* (2013.01); *H03H 17/025* (2013.01); *H03H 17/0213* (2013.01); *H03H 17/0223* (2013.01); *H03H 17/0227* (2013.01); *H03H 17/06* (2013.01)

(58) Field of Classification Search
CPC ............. H04B 1/1036; H03H 17/0213; H03H 17/0223; H03H 17/0227; H03H 17/025; H03H 17/06
See application file for complete search history.

(56) References Cited

U.S. PATENT DOCUMENTS

2008/0103535 A1* 5/2008 Ostroff .................... A61N 1/37
607/2

OTHER PUBLICATIONS

International Search Report and Written Opinion for International Application No. PCT/SE2016/050582, dated Feb. 10, 2017, 11 pages.

(Continued)

*Primary Examiner* — Jaison Joseph
(74) *Attorney, Agent, or Firm* — NDWE LLP

(57) ABSTRACT

A radio communication receiver and a method performed by the radio communication receiver for configuring a Notch filter of the radio communication receiver. The method comprises retrieving stored and previously determined filter coefficients from a set of filter coefficients, where the retrieved filter coefficients constitute a fraction of the total number of filter coefficients; and setting the rest of the filter coefficients to one. The method further comprises normalising the retrieved filter coefficients; and transforming the filter coefficients such that the Notch position ends up at the one or more frequencies to be filtered out.

20 Claims, 8 Drawing Sheets

(56) References Cited

OTHER PUBLICATIONS

Toma Miyata et al., "A Reducing the Number of Polynomial Coefficients Method for Variable Notches FIR Filters," 2010, pp. 272-275, IEEE.
Pavel Zahradnik et al., "Fast Analytical Design Algorithms for FIR Notch Filters," Mar. 2004, pp. 608-623, IEEE Transactions on Circuits and Systems—I: Regular Papers, vol. 51, No. 3.
International Preliminary Report on Patentability for International Application No. PCT/SE2016/050582, dated Dec. 27, 2018, 9 pages.

* cited by examiner

| Offset $\xi_0$ | $g_{-1}$ | $g_0$ | $g_1$ | $g_2$ |
|---|---|---|---|---|
| 0 | 0.9000 | 0.0000 | 0.8946 | 0.9895 |
| 0.05 | 0.9003 | 0.0003 | 0.7587 | 0.9895 |
| 0.1 | 0.9012 | 0.0012 | 0.6471 | 0.9647 |
| 0.15 | 0.9025 | 0.0247 | 0.5543 | 0.9554 |
| 0.2 | 0.9041 | 0.0407 | 0.4765 | 0.9476 |
| 0.25 | 0.9059 | 0.059 | 0.4104 | 0.9410 |
| 0.3 | 0.9081 | 0.0805 | 0.3536 | 0.9354 |
| 0.35 | 0.9104 | 0.1039 | 0.3044 | 0.9304 |
| 0.4 | 0.9130 | 0.1295 | 0.2612 | 0.9261 |
| 0.45 | 0.9152 | 0.1518 | 0.2302 | 0.9230 |
| 0.5 | 0.9189 | 0.1886 | 0.1886 | 0.9189 |

Fig. 2a

| $\bar{\delta}$ | $g_{-1}$ | $g_0$ | $g_1$ | $g_2$ |
|---|---|---|---|---|
| 0 | 0.175027747012067 | 0.000000003046143 | 0.175012960181596 | 0.999971067630516 |
| 0.05 | 0.192188849146112 | 0.000001214750476 | 0.133053604390668 | 0.884516387353740 |
| 0.1 | 0.209891209134382 | 0.000019802090746 | 0.100876399235740 | 0.788297471410847 |
| 0.15 | 0.228189330274427 | 0.000094284370005 | 0.076206601117344 | 0.707585483541290 |
| 0.2 | 0.247172277138783 | 0.000278716193898 | 0.057297216906276 | 0.639376332819479 |
| 0.25 | 0.266967178411443 | 0.000638737216308 | 0.042810523622934 | 0.581253402765326 |
| 0.3 | 0.287721598958453 | 0.001250111758780 | 0.031734183620422 | 0.531321897517639 |
| 0.35 | 0.309691460068606 | 0.002203151433238 | 0.023266804410820 | 0.487925863879991 |
| 0.4 | 0.333120226537142 | 0.003602717609186 | 0.016826015631190 | 0.449872607904470 |
| 0.45 | 0.358333677856794 | 0.005575955744894 | 0.011955477558345 | 0.416155306381412 |
| 0.5 | 0.385840187763113 | 0.008291279781256 | 0.008292421930876 | 0.385850634490440 |

Fig. 2b

RADIO COMMUNICATION RECEIVER AND METHOD FOR CONFIGURING A NOTCH FILTER OF THE RADIO COMMUNICATION RECEIVER

CROSS-REFERENCE TO RELATED APPLICATIONS

This application is a National stage of International Application No. PCT/SE2016/050582, filed Jun. 15, 2016, which is hereby incorporated by reference.

TECHNICAL FIELD

The present disclosure relates to radio communication and in particular to a radio communication receiver for configuring a Notch filter of the radio communication receiver.

BACKGROUND

Narrowband interference, NBI, is an increasing problem for radio communication systems. In particular at low frequency bands since everyone wants to leverage on good propagation properties. Examples of NBI sources include e.g. TV transmitters, push-to-talk systems or unlicensed transmissions. NBI is also a problem in many other situations. One example is when re-farming Global System for Mobile communication, GSM, spectrum to Wideband Code Division Multiple Access, WCDMA. In this case the operator typically wants to keep some spectrum for GSM, while gradually increasing the bandwidth for WCDMA. Since many operators have limited spectrum this is of course challenging. As an example, assume that an operator has 6 MHz spectrum and wants to use 12 GSM carriers (2.4 MHz). Then there is 3.6 MHz left for WCDMA, which is significantly less than for a normal 5 MHz WCDMA carrier. Hence, even though WCDMA may use reduced bandwidth Rx and/or Tx filters, it is likely that GSM will create strong narrowband interference towards the WCDMA, and vice versa.

To mitigate narrowband interference, one approach is to filter out the interference by creating a narrow and deep Notch in the frequency part affected by the interference. This will hopefully remove the harmful interference without negatively affect the desired signal spectrum too much.

The Narrowband Interference Rejection, NBIR, may be implemented in different ways and the implementation may reside in radio, baseband or a combination thereof.

NBIR has been commercially available for WCDMA for a few years and has been a successful feature. Due to the benefits with NBIR, it is of interest to enhance the NBIR capability. For example, it would be desired to cover more diverse interference scenarios and remove potential problems with existing schemes. Examples of improvement areas include adding support for handling very strong interference, and to enhance the robustness/stability of the NBIR functionality.

SUMMARY

The object is to obviate at least some of the problems outlined above. In particular, it is an object to provide a radio communication receiver and a method performed thereby for configuring a Notch filter of the radio communication receiver for filtering out one or more frequencies. These objects and others may be obtained by providing a radio communication receiver and a method performed by a radio communication receiver according to the independent claims attached below.

According to an aspect, a method performed by a radio communication receiver for configuring a Notch filter of the radio communication receiver for filtering out one or more frequencies is provided. The method comprises retrieving stored and previously determined filter coefficients from a set of filter coefficients, where the retrieved filter coefficients constitute a fraction of the total number of filter coefficients; and setting the rest of the filter coefficients to one. The method further comprises normalising the retrieved filter coefficients; and transforming the filter coefficients such that the Notch position ends up at the one or more frequencies to be filtered out.

According to an aspect, a radio communication receiver for configuring a Notch filter of the radio communication receiver for filtering out one or more frequencies is provided. The radio communication receiver is configured for retrieving stored and previously determined filter coefficients from a set of filter coefficients, where the retrieved filter coefficients constitute a fraction of the total number of filter coefficients; and setting the rest of the filter coefficients to one. The method further comprises normalising the retrieved filter coefficients; and transforming the filter coefficients such that the Notch position ends up at the one or more frequencies to be filtered out.

The radio communication receiver and the method performed thereby may have several possible advantages. One possible advantage is that the computational complexity is reduced. A further possible advantage it may provide a strong tool for handling NBIR. Yet a further possible advantage is that it may provide a strong tool also for efficiently co-deploy two or more Radio Access Technologies, RATs in limited amount of spectrum, which may also be of significant interest in the future for e.g. operators with limited spectrum wanting to re-farm e.g. GSM spectrum to WCDMA.

BRIEF DESCRIPTION OF DRAWINGS

Embodiments will now be described in more detail in relation to the accompanying drawings, in which:

FIG. 2a is Table 1, which is an illustration a solution to equation (7) for different offsets $\xi_0$.

FIG. 2b is Table 2, which is an illustration a solution to equation (10) for $\xi_{-1} = -0.01 + \delta$ and $\xi_1 = 0.01 + \delta$.

DETAILED DESCRIPTION

Briefly described, a radio communication receiver and a method performed thereby for configuring a Notch filter of the radio communication receiver are disclosed. The radio communication receiver may make use of only some filter coefficients instead of all filter coefficients for configuring the Notch filter.

Embodiments herein relate to a method performed by a radio communication receiver for configuring a Notch filter of the radio communication receiver for filtering out one or more frequencies. Embodiments of such a method will now be described with reference to FIGS. 1a-1d.

Figure 1A:
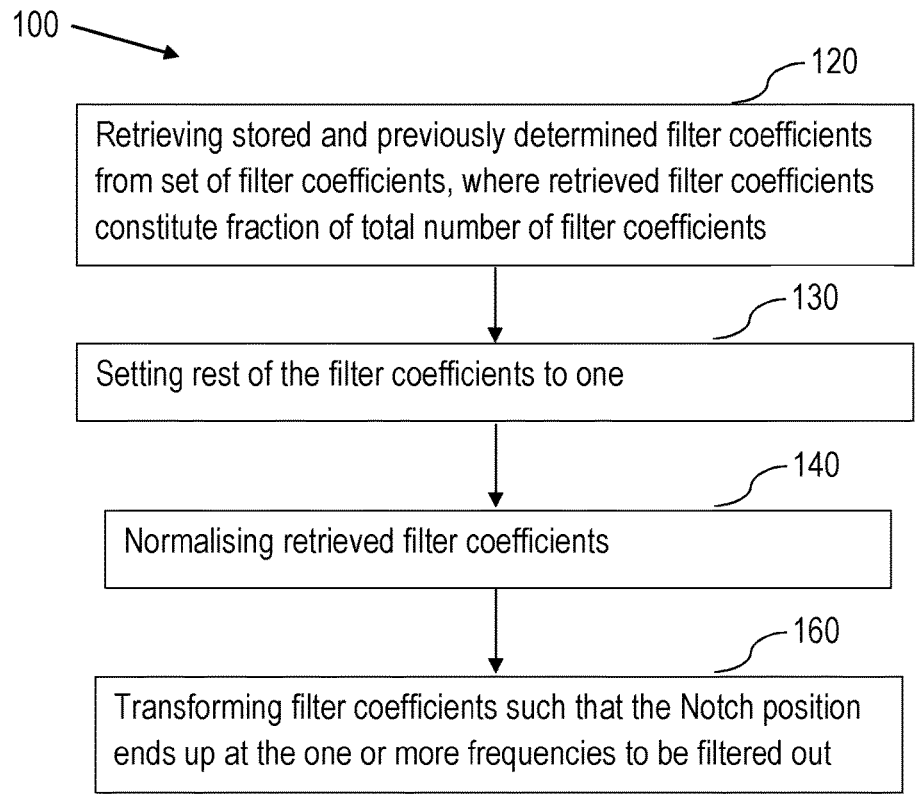
FIG. 1a is a flowchart of a method performed by a radio communication receiver for configuring a Notch filter according to an exemplifying embodiment.
Figure 1B:
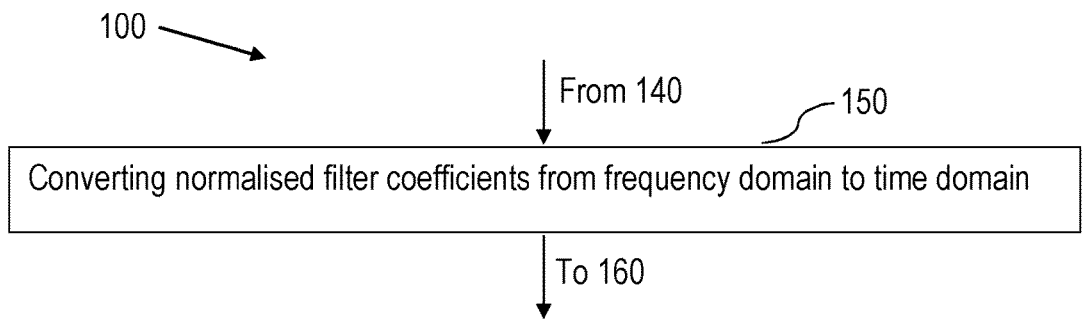
FIG. 1b is a flowchart of a method performed by a radio communication receiver for configuring a Notch filter according to yet an exemplifying embodiment.
Figure 1C:
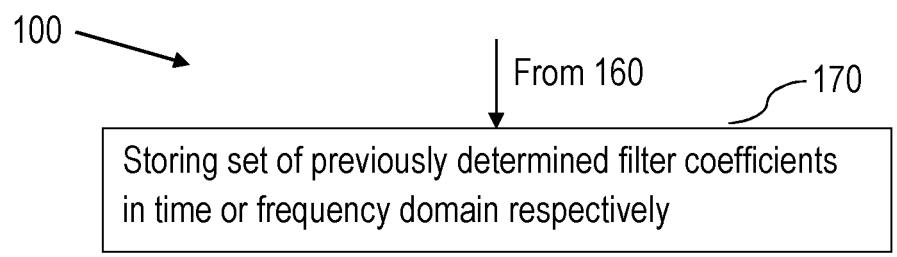
FIG. 1c is a flowchart of a method performed by a radio communication receiver for configuring a Notch filter according to still an exemplifying embodiment.
Figure 1D:
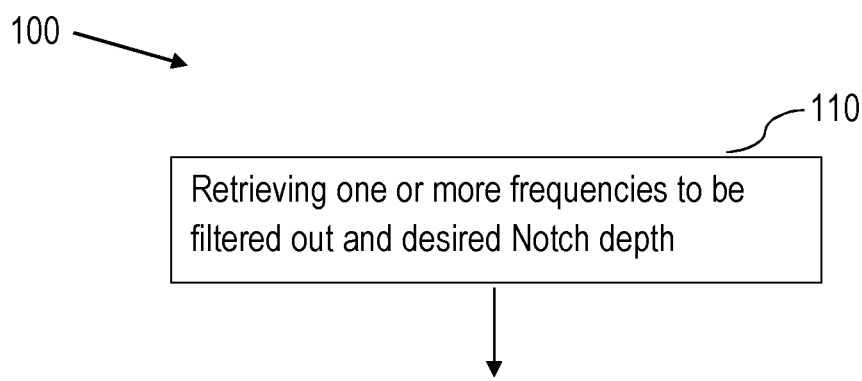
FIG. 1d is a flowchart of a method performed by a radio communication receiver for configuring a Notch filter according to a further exemplifying embodiment.

FIG. 1a illustrates the method comprising retrieving 120 stored and previously determined filter coefficients from a set of filter coefficients, where the retrieved filter coefficients constitute a fraction of the total number of filter coefficients; and setting 130 the rest of the filter coefficients to one. The method 100 further comprises normalising 140 the retrieved filter coefficients; and transforming 160 the filter coefficients such that the Notch position ends up at the one or more frequencies to be filtered out.

Generally, a Notch filter is defined by, or associated with, a large number of filter coefficients, generally hundreds or even thousands in order to realise all combination of Notch depth, Notch position etc. Generally, the Notch filter is determined or calculated based on the filter coefficients in e.g. MATLAB and then implemented in e.g. a radio receiver. The computations are usually complex and resource demanding, which is a reason why they are generally performed using e.g. MATLAB. The computational complexity is more or less proportional to the number of filter coefficients.

In the method performed by the radio communication receiver, only a few filter coefficients are retrieved by the radio communication receiver. The retrieved filter coefficients constitute merely a fraction of the total number of filter coefficients. As will be described below, the number of retrieved stored and previously determined filter coefficients is quite small, e.g. only two when the total number of filter coefficients may be hundreds/thousands.

The radio communication receiver then sets the rest of the filter coefficients to one. The rest of the filter coefficients are the total number of filter coefficients minus the retrieved filter coefficients. The rest of the filter coefficients are initially set to one.

By retrieving only a few stored and previously determined filter coefficients and setting the rest of the filter coefficients to one, the required memory consumption can be kept at a minimum.

The radio communication receiver then normalises the retrieved filter coefficients. Normalising the retrieved filter coefficients is done by multiplying all coefficients by a constant determined such that the resulting filter gives unit gain as response to a known input signal. Furthermore, a small constant is added to all coefficients resulting in a Notch with a user-specified depth. Hence, by normalising the retrieved filter coefficients, it is possible to achieve a user-specified Notch depth and unit gain as response to a known input signal. The known input signal may be Radio Resource Control, RRC, filtered white noise. This may ensure that the normalisation step is straightforward and computationally simple. Required information such as for example the shape of the known input signal could pre-calculated and stored. For example, in the case of RRC filtered white noise, the RRC filter weights could pre-calculated and stored.

Once the retrieved filter coefficients are normalised, the radio communication receiver transforms the filter coefficients such that the Notch position ends up at the one or more frequencies to be filtered out. By transforming the filter coefficients the Notch filter centre position will be at the desired location.

The Notch filter may be of type Finite Impulse Response, FIR, filter. A FIR filter is a filter whose impulse response is of finite duration, because it settles to zero in finite time. The designed Notch filter is inherently stable and linear phase.

The method performed by the radio communication receiver has a plurality of possible advantages. One possible advantage is that the computational complexity is reduced. A further possible advantage it may provide a strong tool for handling NBIR. Yet a further possible advantage is that it may provide a strong tool also for efficiently co-deploy two or more Radio Access Technologies, RATs in limited amount of spectrum, which may also be of significant interest in the future for e.g. operators with limited spectrum wanting to re-farm e.g. GSM spectrum to WCDMA.

Consider the example of the following symmetric Finite Impulse Response, FIR, notch filter with an odd number of filter coefficients L=2N+1 and transfer function given by $$H(q) = \sum_{n=-N}^{N} h_n q^{-n}, \quad (1)$$

where q denotes the discrete-time shift operator and the set of time-domain filter coefficients $\{h_n\}$ is determined from the inverse DFT $$h_n = \frac{1}{L} \sum_{k=-N}^{N} g_k \exp\left(\frac{2\pi i k n}{L}\right), \quad (2)$$

where the frequency-domain filter coefficients $\{g_k\}$ are design parameters used to tune the Notch filter (1). The frequency response of the filter H(q) is given by $$H(f) = H(e^{i2\pi f/f_s}) = \sum_{n=-N}^{N} h_n \exp(-i2\pi n f / f_s), \quad (3)$$

where $f_s$ denotes the sampling frequency (for example, $f_s=2\times3.84$ MHz for a WCDMA system with oversampling two). By combining (2) and (3) we get $$H(f) = \frac{1}{L} \sum_{n=-N}^{N} \sum_{k=-N}^{N} g_k \exp\left(\frac{2\pi i k n}{L}\right) \exp(-i2\pi n f / f_s) \quad (4)$$

-continued $$= \sum_{k=-N}^{N} g_k \frac{1}{L} \sum_{n=-N}^{N} \exp\left(\frac{2\pi i k n}{L}(k - fL/f_s)\right)$$

$$= \sum_{k=-N}^{N} g_k K(fL/f_s - k) = \sum_{k=-N}^{N} g_k K(\xi - k)$$

where $\xi = f \times L/f_s$ and the Kernel is $$K(\xi) = \frac{1}{L} \frac{\sin(\pi \xi)}{\sin\left(\frac{\pi \xi}{L}\right)},$$

$K(0)=1$.

The properties of the filter (1) are determined by tuning the unknowns $\{g_k\}$. In total there are L degrees of freedom that can be used to impose desired constraints on the frequency response (4). Some examples of design choices for a Notch filter comprise, but are not limited to:

Passband ripple—that is to control the degree of ripple occurring in the part of the frequency response that typically should be close to 1.

Stopband ripple—that is to control the degree of ripple occurring in the part of the frequency response that typically should be close to 0 (or the stopband attenuation).

Stopband attenuation—that is to control the degree of signal attenuation occurring in the part of the spectrum that should be reduced/removed.

By the method described above:

Few user-parameters need to be pre-computed and stored. This may be particularly beneficial on older hardware platforms with potentially limited available memory.

The filter may be inherently stable and linear phase, something that is highly desirable.

The Notch may be very smooth.

The Notch depth may be set dynamically. Similarly, the Notch width may be controlled.

The design may ensure correct scaling of the filter to get unit gain for the thermal noise. This is important to keep a consistent view of the Rise over Thermal, RoT, which may affect many system aspects/algorithms, as will be described in more detail below.

The method may further comprise comprising converting 150 the normalised filter coefficients from the frequency domain to the time domain.

By converting the normalised filter coefficients from the frequency domain to the time domain, it is possible to see how a signal to the Notch filter changes over time. A frequency-domain graph shows how much of the signal lies within each given frequency band over a range of frequencies. There are different mathematical operators that may be used for converting the normalised filter coefficients from the frequency domain to the time domain, e.g. the inverse Fourier transform.

The hardware of the radio communication receiver may be designed to perform filtering of signals in the time domain. Hence, the Notch filter then needs to be in time domain. In another alternative hardware implementation one could consider to do the filtering in frequency domain, hence, the Notch filter needs to be in the frequency domain.

The actions or steps described above may be performed in various orders. In a first example, the actions are performed in the order of (a) retrieving 120 stored and previously determined filter coefficients, wherein the filter coefficients have been stored in the frequency domain, setting 130 the rest of the filter coefficients to one, normalising 140 the retrieved filter coefficients, converting 150 the normalised filter coefficients from the frequency domain to the time domain, and transforming 160 the filter coefficients in time domain. In a second example, the actions are performed in the order of (b) retrieving 120 stored and previously determined filter coefficients, wherein the filter coefficients have been stored in the frequency domain, setting 130 the rest of the filter coefficients to one, normalising 140 the retrieved filter coefficients, transforming 160 the filter coefficients in frequency domain and converting 150 the normalised filter coefficients from the frequency domain to the time domain. In a third example, the actions are performed in the order of (c) retrieving 120 stored and previously determined filter coefficients, wherein the filter coefficients have been stored in the time domain, setting 130 the rest of the filter coefficients to one, normalising 140 the retrieved filter coefficients, and transforming 160 the filter coefficients.

Depending on e.g. whether the Notch filter is a fixed Notch filter or a dynamic Notch filter, the order in which the action are performed may be different.

In the first example or alternative, (a) for a fixed Notch filter, the actions may be performed in the order of retrieving 120 stored and previously determined filter coefficients, wherein the filter coefficients have been stored in the frequency domain, setting 130 the rest of the filter coefficients to one, normalising 140 the retrieved filter coefficients, converting 150 the normalised filter coefficients from the frequency domain to the time domain, and transforming 160 the filter coefficients in time domain. One major difference of the fixed Notch filter compared to the dynamic Notch filter is that the filter is semi-static, i.e. the filter coefficients are determined once and then remain unchanged until a change in any of the user-defined filter inputs is triggered, something that happens very infrequently. Hence, one can afford the filter design to be a bit more computationally demanding. In one embodiment the fixed Notch filter design, sets the Notch position in time-domain as compared to the frequency-domain for the dynamic Notch filter. This is done by multiplying all time-domain filter coefficients by the corresponding FFT-shift weights. This is computationally more demanding than applying frequency-domain shifting and mirroring operations, but has the benefit that an exact filter position can be chosen.

For the fixed Notch filter, it may be convenient to choose a precomputed filter associated with a centre Notch position at zero frequency, since then it becomes easy to translate the position to the desired position in a later stage. Nothing prevents that one uses a precomputed filter associated with any other centre frequency than zero though.

In the second example or alternative, (b) for a dynamic Notch filter, the actions may be performed in the order of retrieving 120 stored and previously determined filter coefficients, wherein the filter coefficients have been stored in the frequency domain, setting 130 the rest of the filter coefficients to one, normalising 140 the retrieved filter coefficients, transforming 160 the filter coefficients in frequency domain and converting 150 the normalised filter coefficients from the frequency domain to the time domain. One major objective with this approach is computational simplicity. Since the filter coefficients may be updated with a new position and depth each processing iteration, this may be very important, especially on older hardware where Million Instructions Per Second, MIPS, are valuable resources. Hence, various tricks may be applied for setting the Notch position in order to keep the computational demand low. More specifically, let the number of harmonics equal the ratio between the desired Notch centre position and the periodicity of the filter rounded to the closest integer, where the periodicity of the filter is given as the sampling rate divided by the number of filter coefficients. Also, the set of pre-calculated filters consists of a number of filters with centre frequencies ranging from zero to half the filter periodicity. Then, in order to set the desired Notch position, retrieve the filter coefficients from the set of pre-calculated filter coefficients corresponding to the centre frequency that is closest in frequency-distance to the absolute value of the distance between the desired position and the periodicity of the filter times the number of harmonics. If the distance between the desired position and the periodicity of the filter times the number of harmonics is negative, then mirror the retrieved filter coefficients around the centre coefficient. Finally, circularly shift the filter coefficients according to the number of harmonics. Note that if the number of harmonics is negative the circular shift is to the left, whereas if the number of harmonics is positive the circular shift is to the right.

Merely as an illustrating example of the above, consider a system with sampling frequency $f_s$=2.5 MHz, L=5 filter coefficients in the Notch filter, and n=5 sets of stored filter coefficients $G_0$, $G_1$, $G_2$, $G_3$, $G_4$, $G_5$ with associated centre frequencies 0, 0.05, 0.1, 0.15, 0.2, 0.25 (MHz). The desired filter position is $f_d$=0.3 MHz. The periodicity of the filter is then given by $f_p$=$f_s$/L=0.5 MHz, and the number of harmonics equals $N_h$=round ($f_d/f_p$)=round(0.3/0.5)=1. To determine the set of filter coefficients to retrieve, we calculate |$f_p$−$f_iN_h$|=|0.3−0.5*1|=0.2. Hence, the filter coefficients associated with the set $G_4$ are retrieved. Let us assume that two coefficients are retrieved, $g_0$ and $g_1$, and the rest are set to 1. The total filter then looks like $G_4$=[1 1 $g_0$ $g_1$ 1]. Since the quantity $f_p$−$f_iN_h$=0.3−0.5*1=−0.2 is negative, the filter coefficients are mirrored around the centre coefficient $g_0$, rendering $G_4$=[1 $g_1$ $g_0$ 1 1]. Finally, the filter coefficients are circularly shifted according to the number of harmonics $N_h$=1, giving a filter with desired Notch position $G_4$=[1 1 $g_1$ $g_0$ 1]. Since the number of harmonics $N_h$=1 is positive, the shifting was in the right direction. See also FIG. 2e.

In the third example or alternative, (c), the actions may be performed in the order of retrieving 120 stored and previously determined filter coefficients, wherein the filter coefficients have been stored in the time domain, setting 130 the rest of the filter coefficients to one, normalising 140 the retrieved filter coefficients, and transforming 160 the filter coefficients. In this example, there may not even be any other filter coefficients, hence there are no "rest of the filter coefficients". In this embodiment, the Notch filter design is done solely in the time-domain. Hence, pre-computed normalised time-domain filter coefficients for a fixed Notch position and Notch depth, and with the correct gain as response to a known input signal are stored in memory, retrieved, manipulated to obtain the desired Notch depth and Notch position. This embodiment avoids any conversion between time- and frequency domain, but requires all relevant filter coefficients to be stored. Typically, for a length L>>2 Notch filter, all L coefficients need to be stored in memory. This might be feasible in newer radio platforms with more memory. On the other hand, in this case only one filter needs to be stored. In this embodiment, the step of ensuring the correct Notch position corresponds to adding the Notch depth to the centre coefficient (DC coefficient), and the step of setting the Notch position corresponds to multiplying all time-domain filter coefficients by the corresponding FFT-shift weights. In one embodiment, the filter can be re-normalized again once the correct Notch position has been ensured, which might be required to guarantee the correct gain. The time-domain normalisation consists of calculating a quadratic form of the time-domain coefficients with the raised cosine function as the weighting matrix, and then obtain the normalised coefficients by dividing the original coefficients with the square root of this number.

The method may further comprise storing 170 the set of previously determined filter coefficients in the time or frequency domain respectively After the above described actions have been performed, the result may be stored in the frequency domain or the time domain. The actions may comprise one or more of normalising 140 the retrieved filter coefficients, transforming 160 the filter coefficients in frequency domain and converting 150 the normalised filter coefficients from the frequency domain to the time domain. Thus, the result may be stored so that it is not necessary to perform the same calculations or actions once again later. In this manner, initial or baseline filter coefficients are pre-computed and stored, which are then later retrieved 120, processed and applied in the Notch filter as described above.

As briefly stated above, two exemplifying designs will be described, herein referred to as design 1 and design 2. Design 1 aims at a very narrow Notch at frequency $f_0$. This is achieved by letting the frequency response and its derivative in $f_0$ equal zero, i.e.:

$$H(f_0)=0 \ H'(f_0)=0. \tag{5}$$

The latter constraint needs to be true for a local minimum, which is exactly what we want to achieve. There are two equations, and thus there can only be two unknowns to get a unique solution. The unknowns will be $g_0$ and $g_1$. To further control the shape of the Notch, the neighbours to the two unknowns are constrained according to $$g_{-1}=0.9+0.1g_0, \ g_2=0.9+0.1g_1, \tag{6}$$

while the rest of the L−4 $g_k$ coefficients are set to one.

By letting $\xi_0=f_0 \times L/f_s$, and imposing the constraints (5) and (6) on (4), the following system of equations is obtained:

$$\begin{bmatrix} 0.1K(\xi_0+1)+K(\xi_0) & 0.1K(\xi_0-2)+K(\xi_0-1) \\ 0.1K'(\xi_0+1)+K'(\xi_0) & 0.1K'(\xi_0-2)+K'(\xi_0-1) \end{bmatrix} \begin{bmatrix} g_0 \\ g_1 \end{bmatrix} = \tag{7}$$

$$-\begin{bmatrix} 0.9K(\xi_0+1)+0.9K(\xi_0-2)+\sum_{\substack{n=-N \\ n<-1,n>2}}^{N} K(\xi_0-n) \\ 0.9K'(\xi_0+1)+0.9K'(\xi_0-2)+\sum_{\substack{n=-N \\ n<-1,n>2}}^{N} K'(\xi_0-n) \end{bmatrix},$$

which, assuming that the left-hand matrix has full rank, gives a unique solution for $g_0$ and $g_1$, and hence for all $g_k$. See Table 1 in FIG. 2a for the solution of (7) for different $\xi_0$.

The objective of design 2 is a notch filter with centre frequency at $\xi_0=f_0 \times L/f_s$ and a controllable width $\Delta=\xi_1-\xi_{-1}$. This can be achieved by designing a filter that minimises the energy passing in the frequency interval [$\xi_{-1}$,$\xi_1$], where $\xi_0=(\xi_{-1}+\xi_1)/2$, which can be expressed as minimising the objective function:

$$F(g) = \int_{\xi_{-1}}^{\xi_1} |H(\xi)|^2 d\xi = \qquad (8)$$

$$\sum_{n,m=-N}^{N} g_n g_m^* \int_{\xi_{-1}}^{\xi_1} K(\xi-n)K(\xi-m)d\xi = \sum_{n,m=-N}^{N} a_{n,m} g_n g_m^*,$$

where $$a_{n,m} = \int_{\xi_{-1}}^{\xi_1} K(\xi-n)K(\xi-m)d\xi.$$

Again it is only allowed to vary $g_{-1}, g_0, g_1, g_2$ while all other $g_k$ are set to one. The quadratic form has a unique minimum found by solving a set of linear equations:

$$\frac{\partial F(g)}{\partial g_k} = 2\sum_{n=-N}^{N} a_{n,k} g_n = 0, k = -1, 0, 1, 2 \qquad (9)$$

which can be written in matrix form as $$C\hat{g} = -b; \qquad (10)$$

$$C = \begin{pmatrix} a_{-1,-1} & a_{0,-1} & a_{1,-1} & a_{2,-1} \\ a_{-1,0} & a_{0,0} & a_{1,0} & a_{2,0} \\ a_{-1,1} & a_{0,1} & a_{1,1} & a_{2,1} \\ a_{-1,2} & a_{0,2} & a_{1,2} & a_{2,2} \end{pmatrix},$$

$$\hat{g} = \begin{pmatrix} g_{-1} \\ g_0 \\ g_1 \\ g_2 \end{pmatrix}, b = \begin{pmatrix} b_{-1} \\ b_0 \\ b_1 \\ b_2 \end{pmatrix},$$

$$\text{with } b_k = \sum_{\substack{n=-N \\ n<-1, n>2}}^{N} a_{n,k}.$$

Figure 2C:
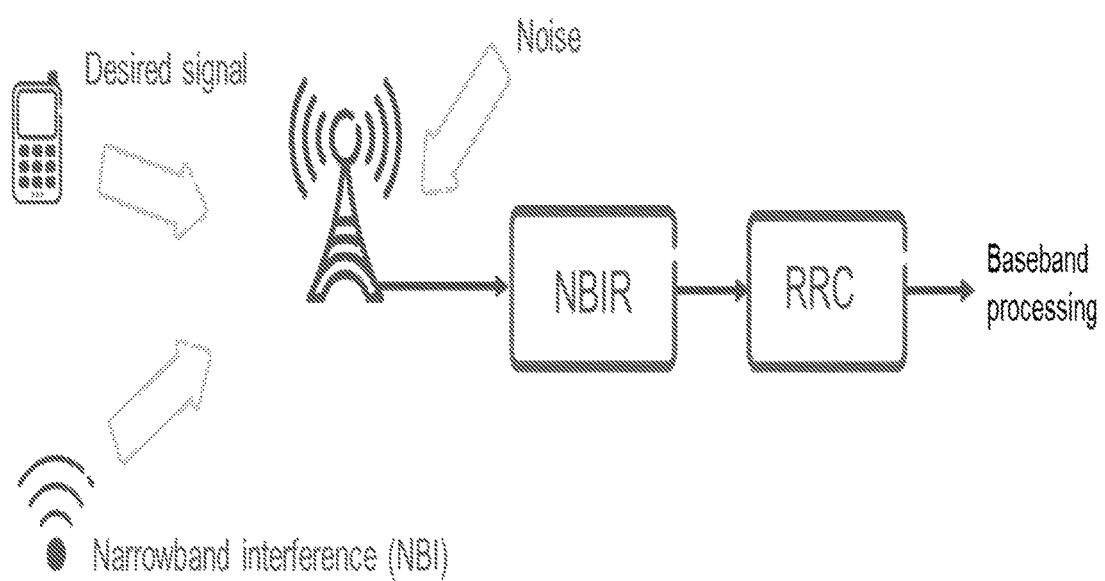
FIG. 2c is a block diagram of a possible implementation of NBIR.

The solution for $\xi_{-1}=-\delta_f L/f_s+\delta$ and $\xi_1=\delta_f L/f_s+\delta$ with $f_s=100$ Hz and different values of $\delta$ can be found in table 2 in FIG. 2b, for $\xi_{-1}=-0.01+\delta$ and $\xi_1=0.01+\delta$.

Below a number of general properties for the filter (1) and its relation to the corresponding frequency representations (2) and (3) are given:

Assuming that all $g_k$ are real-valued, then the FIR filter (1) is linear phase and the time-domain coefficients satisfy $h_n = h^*_{-n}$.

The FIR filter (1) is stable by construction.

Note that (2) states that $h_n$ and $g_k$ are related via DFT/IDFT transforms.

Let $g=[g_{-N}, \ldots, g_N]$ be associated with $H(\xi_0)$. Then it holds that a circular shift of the coefficients in the vector g corresponds to a frequency shift by $f_s/L$, and shifting right or left, respectively, corresponds to a positive or a negative frequency shift. For example, a circular shift of g by one step to the left implies that $$g'=[g_{-N+1}g_1g_{-N}] \Rightarrow H'(\xi_0)=H(\xi_0+f_s/L) \qquad (11)$$

Secondly, let $g=[g_{-N}, \ldots, g_N]$ be associated with a design yielding a notch at $\xi_0$. Then it holds that by mirroring the coefficients around the centre tap $g'=[g_N, \ldots, g_{-N}]$ yields a filter with a notch at $-\xi_0$.

The action of normalising the retrieved filter coefficients may comprise normalising with regards to the notch depth and noise floor.

Normalising in the frequency domain is done by computing the multiplication of the squared modulus of the filter frequency response and the squared modulus of the desired signal's frequency response (e.g. root-raised cosine filter); normalised by the squared modulus of the desired signals frequency response, and then divide all filter coefficients by the square root of this number. The normalising may also be done in the time domain, then the multiplication of all coefficients becomes a convolution and adding a constant to all coefficients becomes adding a small constant to the DC component.

The normalising may be done with regards to various objects to achieve. For example, with regards to the notch depth and noise floor.

For example, a received signal may be seen as a composed of different components:

$$y=y_d+y_n+y_i, \qquad (12)$$

where $y_d$ denotes the desired WCDMA signal, $y_n$ represents the thermal noise component, and $y_i$ is the narrowband interference signal. Evidently, most of, or all, these components may be affected by the Narrow Band Interference Rejection, NBIR, filter. A general objective when enabling NBIR is to remove as much as possible of the narrowband interference term $y_i$, minimise the impact on $y_d$, and preserve the power of the noise term $y_n$. The latter is particularly important in a WCDMA system since changing the noise power will affect the rise-over-thermal, RoT, which is a very important measure of stability.

The WCDMA signal, many users or on average, is modelled as Root Raised Cosine, RRC, filtered white noise, the thermal noise is assumed to have uniform spectral density, and the distribution of the interferer is unknown. After the NBIR equaliser filter H and the RRC filter the Power Spectral Density, PSD, of the received signal becomes $$PSD_Y(\xi)=H(\xi)^2 RC(\xi)(PSD_{N_0}(\xi)+PSD_{WCDMA}(\xi)+PSD_I(\xi)), \qquad (13)$$

where RC denotes $RRC^2$. Thus the gains associated with the NBIR equaliser weights are:

$$\gamma_{N_0} = \frac{\int H(\xi)^2 RC(\xi) PSD_{N_0}(\xi) d\xi}{\int RC(\xi) PSD_{N_0}(\xi) d\xi} = \frac{\int H(\xi)^2 RC(\xi) d\xi}{\int RC(\xi) d\xi} \qquad (14)$$

$$\gamma_{WCDMA} = \frac{\int H(\xi)^2 RC(\xi) PSD_{WCDMA}(\xi) d\xi}{\int RC(\xi) PSD_{WCDMA}(\xi) d\xi} \approx \frac{\int H(\xi)^2 RC(\xi)^2 d\xi}{\int RC(\xi)^2 d\xi} \qquad (15)$$

$$\gamma_I = \frac{\int H(\xi)^2 RC(\xi) PSD_I(\xi) d\xi}{\int RC(\xi) PSD_I(\xi) d\xi}. \qquad (16)$$

To preserve the noise power after NBIR, the associated gain needs to be one. Hence, it is needed to normalise the frequency filter coefficients with the following normalising factor:

$$\gamma_{N_0} = \frac{\int H(\xi)^2 RC(\xi)d\xi}{\int RC(\xi)d\xi} \approx \frac{\sum_{n=-N}^{N} |H(n)|^2 RC(n)}{\sum_{n=-N}^{N} RC(n)}. \quad (17)$$

That is, the frequency filter coefficients $\{g_k\}$ should be divided by the square root of this factor.

Simulations show that it works well just using the standard 3$^{rd}$ Generation Partnership Project, 3GPP, 5 MHz Raised Cosine, RC, filter (sampled at the same points as H). In fact, it works well to use the standard 3GPP filter for RC also for more narrow WCDMA filters (down to 3.8 MHz). Also the gain error for the WCDMA signal may be very small. Hence, with this scaling the received power is generally never lower than the noise floor of the unfiltered signal. In fact, the power measured from thermal noise and the WCDMA signals are usually almost unchanged.

A second objective related to filter normalisation is that it is desired to control the depth of the Notch filter. The designs outlined above may make the notches very deep, i.e. close to zero. The fact that the filter value in the notch position is close to zero is something that can be explored in order to set a desired notch depth. By adding a factor d corresponding to the desired notch depth to all frequency filter weights, the filter frequency response is lifted by this value, and since the value at the notch centre previously was ~0, the new value will be d.

By combining the two objectives above, the following filter normalisation procedure is deduced:
Compute the normalised frequency filter coefficients $\bar{g}_k$ as $$\bar{g}_k = c(g_k + \alpha) = cg_k + d, \quad (18)$$

where c is determined such that $$\frac{c^2 \sum_{n=-N}^{N} |EQ(n) + \alpha|^2 RC(n)}{\sum_{n=-N}^{N} RC(n)} = 1,$$

under the constraint that $c\alpha = d$,
which has the following solution $$c = d \frac{\sqrt{\chi^2 + \gamma(1 - d^{-2})} - \chi}{\gamma}, \quad (19)$$

where $$\chi = \frac{\sum_{n=-N}^{N} h_n RC(n)}{\sum_{n=-N}^{N} RC(n)}$$

and $$\gamma = \frac{\sum_{n=-N}^{N} h_n^2 RC(n)}{\sum_{n=-N}^{N} RC(n)}.$$

It can be noted that the normalisation procedure may be done in the time-domain as well. To get the desired notch depth, the time-domain centre tap (the Direct Current, DC-component) is increased by the factor d. To determine the noise power constraint normalisation in time-domain, the frequency domain equation needs to be converted into time-domain. Essentially, the multiplications in frequency domain become convolutions in the time-domain. More specifically, compute the factor a according to $$a = \sum_{i,j=-N}^{N} h[i]^* h[j] rc[i-j], \quad rc(0) = 1$$

and then the normalized filter coefficients are obtained by dividing them by the square root of a. Similarly, one can do the noise power constraint normalisation in frequency domain and the notch depth normalisation in time-domain. The benefit of this is that noise power normalisation is computationally easier to do in the frequency domain (multiplications instead of convolutions), while the notch depth normalisation in time-domain only requires one addition operation compared to L addition operations in the frequency domain.

The method may further comprise retrieving 110 one or more frequencies to be filtered out and the desired Notch depth.

Different settings of the coefficients may result in different frequencies to be filtered out. Consequently, in order to know how to pre-calculate and store the filter coefficients, previous to retrieving them, the one or more frequencies to be filtered out and the desired Notch depth is retrieved. Then, the filter coefficients are calculated and stored based on the retrieved one or more frequencies to be filtered out and the desired Notch depth.

Consequently, when the Notch filter is to be configured, the radio communication received retrieves the stored and previously determined filter coefficients, where the retrieved filter coefficients constitute a fraction of the total number of filter coefficients; and sets 130 the rest of the filter coefficients to one. The radio communication receiver may also normalise 140 the retrieved filter coefficients; and transform 160 the filter coefficients such that the Notch position ends up at the one or more frequencies to be filtered out.

The set of stored previously determined filter coefficients may have been determined by solving a set of linear equations based on the conditions that the filter transfer function and its derivative are zero at a certain frequency, where the frequency differs between the filters in the set.

There may be different ways to determine the set of stored previous determined filter coefficients. See above and tables 1 and 2 in FIGS. 2a and 2b respectively.

The set of stored previously determined filter coefficients may have been determined by minimising the amount of energy passing through the Notch filter in a certain frequency range, and where the centre frequency of the frequency range differs between the filters in the set.

By designing the Notch filters by means of minimising the amount of energy passing through the Notch filter in a certain frequency range, and where the centre frequency of the frequency range differs between the filters in the set, see equation (8) above, the radio communication receiver obtains filters with a specific width and different Notch position.

In an example, the frequency range is determined with respect to width and centre position of the Notch filter.

The frequency range may be chosen to range from the centre position minus half the width to the centre position plus half the width. This yields a filter with the Notch centred at the centre position and with a width covering a frequency range equal to the desired width.

The retrieved filter coefficients may correspond to a stored filter with one or more specific centre frequencies equal to zero and where the size of the stored set of filters is one or larger.

The method described above may be used for configuration of both fixed and dynamic Notch filters. A dynamic Notch filter may be seen as an adaptive Notch or FIR filter that dynamically adapts the Notch position and depth to remove a varying interferer.

For a fixed Notch filter, it may comprise one centre frequency. However, for a dynamic Notch Filter, it may have a plurality of centre frequencies corresponding to the number of individual frequencies that may be filtered using the dynamic Notch filter. In other words, a dynamic Notch filter may be thought of as a plurality of individual filters being as many as the number of individual frequencies that may be filtered using the dynamic Notch filter.

The transforming 160 of the filter coefficients may depend on the number of filter harmonics and the periodicity of the Notch filter.

When the filter coefficients are transformed, as described above.

The periodicity of the filter is given as the sampling rate divided by the number of filter coefficients.

The action of retrieving the filter coefficients may further comprise retrieving the filter coefficients from the set of pre-calculated filter coefficients corresponding to the centre frequency that is closest in frequency-distance to the absolute value of the distance between the desired position and the periodicity of the filter times the number of harmonics.

This means that the stored pre-calculated filter coefficients may not correspond completely to a desired Notch filter with regard to frequency. However, the radio communication receiver may select those pre-calculated filter coefficients that may configure the Notch filter to be as close to or as similar as the desired notch filter with regard to the frequency or frequencies that are to be filtered.

The action of transforming the filter coefficients to achieve the desired Notch position may further comprise determining a shift index as the number of harmonics; mirroring the filter coefficients around the centre coefficient if the distance between the desired position and the periodicity of the filter times the number of harmonics is negative; and circularly shifting the filter coefficients according to the shift index, wherein when the number of harmonics is negative the shift is to the left, whereas when the number of harmonics is positive the shift is to the right.

For the dynamic Notch filter, for achieving the desired Notch position for the dynamic notch algorithm the number of harmonics are defined to be equal to the ratio between the desired Notch centre position and the periodicity of the filter, where the periodicity of the filter is given as the sampling rate divided by the number of filter coefficients.

The set of pre-calculated filters consists of a number of filters with centre frequencies ranging from zero to half the filter periodicity, where the size of the set (the number of filters) is a trade-off between frequency granularity and storage memory consumption.

The action of transforming the filter coefficients to achieve the desired Notch position may further comprise adjusting the phase of the time-domain filter coefficients corresponding to the desired centre frequency position.

When the filter coefficients are transformed from the frequency domain to the time domain, the phase may shift a little. Thus in order for the Notch filter to operate properly, the phase shift of the time-domain may be adjusted accordingly.

The radio communication receiver may be comprised in a radio base station or in a wireless device.

There are different examples of nodes or devices in which the radio communication receiver may be implemented. The radio communication receiver may communicate with a radio communication transmitter. The radio communication receiver may be implemented in different contexts, e.g. a radio communication network. When implemented in a radio communication network, the radio communication receiver may be implemented in any node or device receiving radio transmissions. Thus, the radio communication receiver may be implemented or comprised in e.g. a radio base station, wherein the radio communication receiver may receive radio transmissions from e.g. wireless devices. The radio communication receiver may also be implemented or comprised in a wireless device, wherein the radio communication receiver may receive radio transmissions from e.g. radio base stations and/or other wireless devices.

The number of retrieved stored and previously determined filter coefficients is at least two.

As described above, the set of filter coefficients of a Notch filter may be relatively large, e.g. hundreds or even thousands. The number of retrieved stored and previously determined filter coefficients is at least two, wherein the computational complexity is substantially reduced.

In an example, for a fixed Notch filter, the radio communication receiver performing the method described above may then, for placing a fixed notch with centre position at $f_0$ and with depth a [dB]:

(Pre-)Calculate (and store) the frequency-domain filter coefficients $\{g_{-1}, g_0, g_1, g_2\}$ for $\xi=0$ according to (6) and (7) or (10). The remaining L−4 coefficients are set to 1.

Normalise the filter coefficients to get desired filter gain and notch level d according to (18) and (19).

Convert the frequency-domain coefficients $\{\overline{g}_k\}$ to time-domain coefficients $\{h_k\}$ according to (2). Note that this may be achieved by an IFT.

Shift the notch position to the desired position $f_0$ according to $$\overline{h}_k = h_k \exp\left(i\frac{2\pi f_0}{f_s}k\right), k = -N, \ldots, N \qquad (20)$$

Figure 2D:
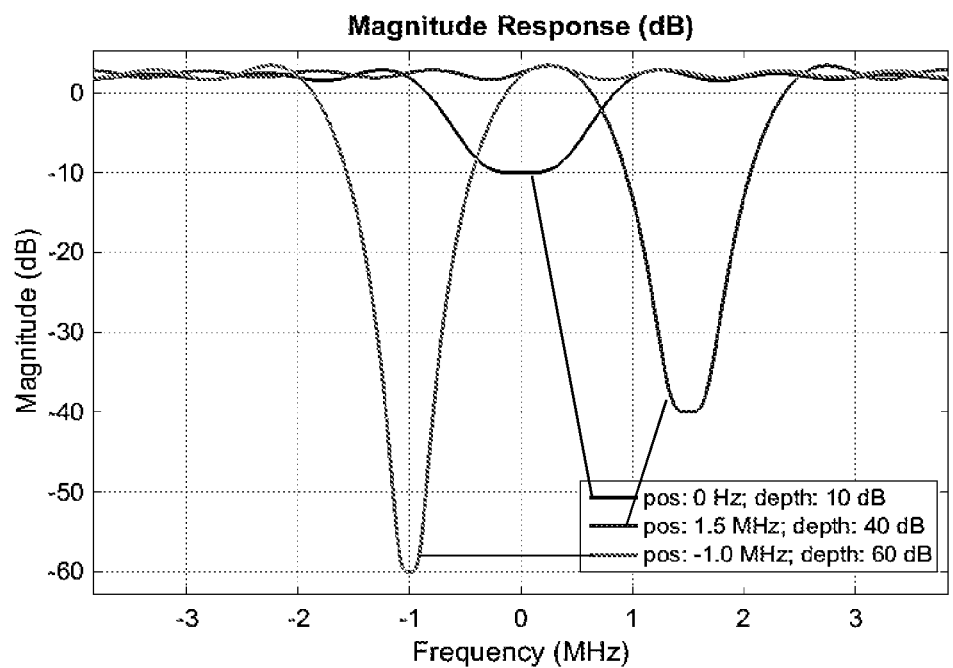
FIG. 2d is an illustration of three different fixed Notch designs with $f_0 = \{0, 1.5M, -1.0M\}$ and $d = 10^{\wedge}(\{10, 40, 60\}/20)$.
Figure 2E:
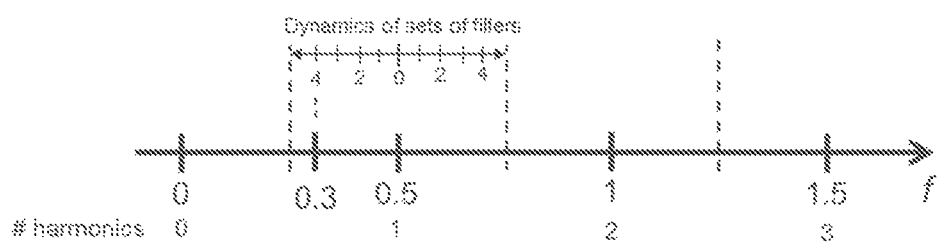
FIG. 2e is an illustration of an example of frequency, number of harmonics for a Notch filter.

An illustration of the frequency response for three different filters derived according to above procedure can be found in FIG. 2d. It should be noted that the RRC filter is not included in the filter normalisation in this illustration (i.e. RC(n)=1 for all n).

In another example, for a dynamic Notch filter, the radio communication receiver performing the method described above may, for dynamically updating the notch position:

First pre-calculate and store the frequency domain filter coefficients $\{g_{-1}, g_0, g_1, g_2\}$ for a number of $\xi \in \{0, \delta, \ldots, 0.5\}$ according to (6) and (7) or (10). The separation between the different pre-calculated notches will be $\delta f_i$, and this determines the maximum frequency 'resolution'. In what follows, $f_i=f_s/L=3.84e6 \times 2/L$ denotes the periodicity of the filter, i.e. the frequency corresponding to a circular shift of the frequency taps.

Second, Iterating and in each iteration, assuming that the new/updated notch position should be centred close to $f_0$, and that the notch depth value should be d, then
1. Determine
   num_harmonics=round($f_0/f_i$)
   filter_index=round(($f_0/f_i$−num_harmonics)/δ)
2. Choose the pre-calculated filter coefficients {$g_{-1}$, $g_0$, $g_1$, $g_2$} corresponding to ξ=δ×|filter_index|. Set the rest of the L−4 frequency coefficients to one. The filter vector is then g=[$g_{-N}$, ..., $g_N$].
3. If filter_index<0, then mirror the frequency coefficients around the centre tap $g_0$.
4. Circularly shift the filter vector g according to num_harmonics (denoted by i below in (21)). This can be expressed as $g' = gS^i$, $$S = \begin{bmatrix} 0 & I \\ 1 & 0 \end{bmatrix}, \quad (21)$$

5. Normalise the filter coefficients to get desired gain and notch level d according to (18) and (19).
6. Convert the frequency-domain coefficient {$g_k$} to time-domain coefficients {$h_n$} according to (2). Note that this may be achieved by an IFT.

The examples and embodiments described above are description is based on a symmetric implementation of the FIR Notch filter (1). Note that it is straightforward to extend this to an asymmetric implementation (which is more practical) of the filter:

$$H(q) = \sum_{n=0}^{L} h_n q^{-n}$$

Furthermore, the discussion has considered an uneven number of filter taps, i.e. L is odd. However, similar approaches are equally applicable to the case when L is even. One benefit of having letting L=$2^x$, for some integer x, is that fast Fourier transform algorithms can be employed. However, today there exist modern tricks that make DFT/IDFT calculations extremely fast anyway.

A first exemplifying embodiment of the method performed by the radio communication receiver, for a frequency domain adaptive Notch filter, may comprise determining a set of filters, where each filter consists of few coefficients. The filters in the set have a notch position ranging between 0 and 0.5 (in normalised frequency). Storing the filter(s) in the frequency domain. The filter coefficients may, for example, be determined by as described above.

The method according to the first exemplifying embodiment may further comprise setting the correct Notch position by applying shift and mirroring operations. Then normalising the filter in frequency domain by multiplying all coefficients by a factor and adding a specific constant to all coefficients. Further the method according to the first exemplifying embodiment may comprise converting the filter from frequency to time domain e.g. by applying Inverse Fast Fourier Transform, IFFT.

A second exemplifying embodiment of the method performed by the radio communication receiver, for a time domain adaptive Notch filter, may comprise determining one complete (all coefficients) filter with notch position in e.g. f=0. The one complete (all coefficients) filter may be determined as described above. The method in this embodiment also comprises storing the filter in the time domain.

The method according to the second exemplifying embodiment may further comprise setting the correct Notch position by multiplying all coefficients by the corresponding FFT-shift weights in the time domain. Then normalising the filter in time domain by scaling all coefficients by the quadratic form and add the specific constant to the DC component.

A third exemplifying embodiment of the method performed by the radio communication receiver, for a fixed Notch filter, may comprise determining a set of filters, where each filter consists of few coefficients. The filters in the set have a notch position ranging between 0 and 0.5 (in normalised frequency). Storing the filter(s) in the frequency domain. The filter coefficients may, for example, be determined by as described above. Then normalising the Notch filter in frequency domain by multiplying all coefficients by a factor and adding a specific constant to all coefficients.

The method according to the third exemplifying embodiment may further comprise converting the filter from frequency- to time-domain; and setting the correct Notch position by multiplying all coefficients by the corresponding FFT-shift weights in time-domain.

Embodiments herein also relate to a radio communication receiver for configuring a Notch filter of the radio communication receiver for filtering out one or more frequencies. The radio communication receiver has the same technical features, objects and advantages as the method performed by the radio communication receiver described above. The radio communication receiver will therefore be described only in brief in order to avoid unnecessary repetition. The radio communication receiver will be described with reference to FIGS. 3 and 4.

Figure 3:
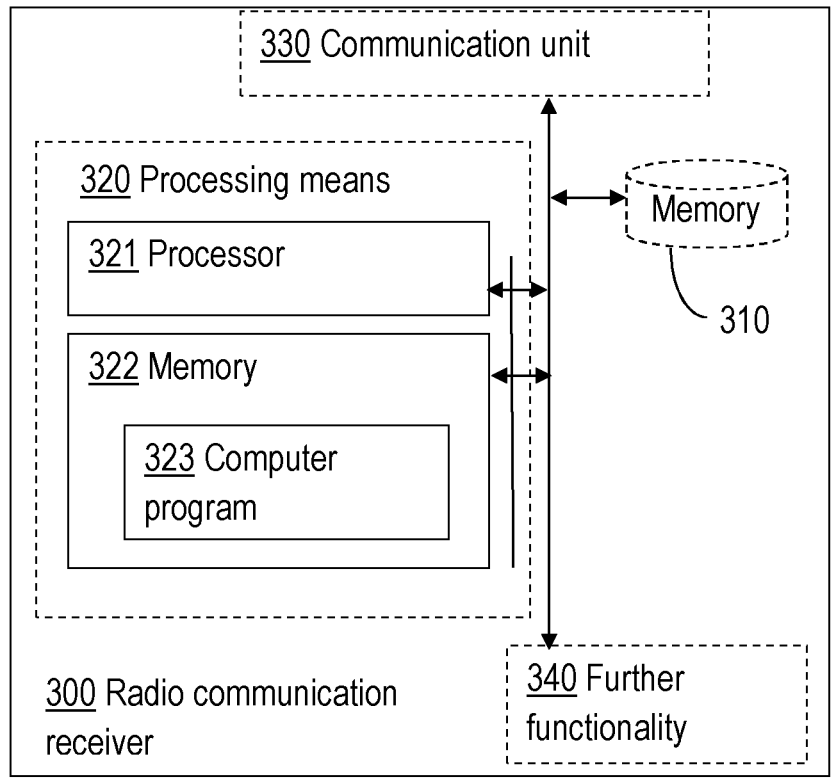
FIG. 3 is a block diagram of a radio communication receiver for configuring a Notch filter of the radio communication receiver according to an exemplifying embodiment.

FIG. 3 illustrates the radio communication receiver 300, 400 being configured for retrieving stored and previously determined filter coefficients from a set of filter coefficients, where the retrieved filter coefficients constitute a fraction of the total number of filter coefficients; and setting the rest of the filter coefficients to one. The radio communication receiver 300, 400 is further configured for normalising the retrieved filter coefficients; and transforming the filter coefficients such that the Notch position ends up at the one or more frequencies to be filtered out.

The radio communication receiver 300, 400 may be realised or implemented in various different ways. A first exemplifying implementation or realisation is illustrated in FIG. 3. FIG. 3 illustrates the radio communication receiver 300 comprising a processor 321 and memory 322, the memory comprising instructions, e.g. by means of a computer program 323, which when executed by the processor 321 causes the radio communication receiver 300 to retrieve stored and previously determined filter coefficients from a set of filter coefficients, where the retrieved filter coefficients constitute a fraction of the total number of filter coefficients; and to set the rest of the filter coefficients to one. The memory further comprises instructions, which when executed by the processor 321 causes the radio communication receiver 300 to normalise the retrieved filter coefficients; and to transform the filter coefficients such that the Notch position ends up at the one or more frequencies to be filtered out.

FIG. 3 also illustrates the radio communication receiver 300 comprising a memory 310. It shall be pointed out that FIG. 3 is merely an exemplifying illustration and memory 310 may be optional, be a part of the memory 322 or be a further memory of the radio communication receiver 300. The memory may for example comprise information relating to the radio communication receiver 300, to statistics of operation of the radio communication receiver 300, just to give a couple of illustrating examples. FIG. 3 further illustrates the radio communication receiver 300 comprising processing means 320, which comprises the memory 322 and the processor 321. Still further, FIG. 3 illustrates the radio communication receiver 300 comprising a communication unit 330. The communication unit 330 may comprise an interface through which the radio communication receiver 300 communicates with other nodes or entities of the communication network as well as other communication units. FIG. 3 also illustrates the radio communication receiver 300 comprising further functionality 340. The further functionality 340 may comprise hardware or software necessary for the radio communication receiver 300 to perform different tasks that are not disclosed herein.

Figure 4:
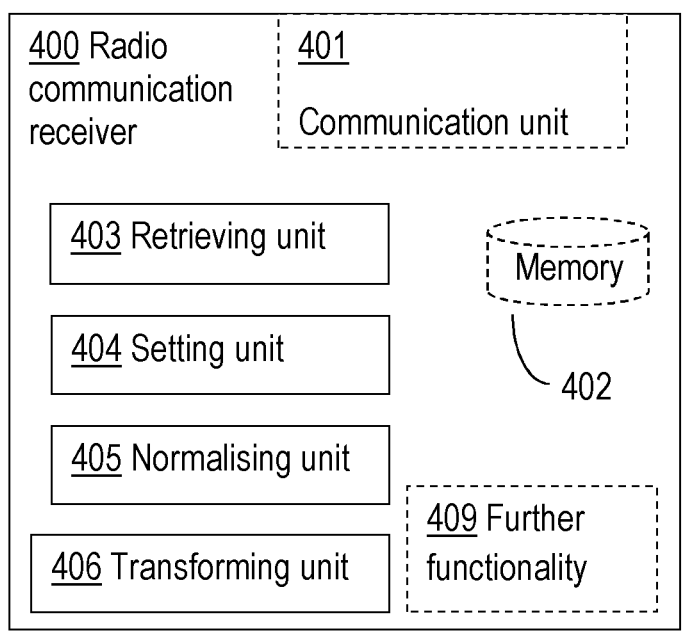
FIG. 4 is a block diagram of a radio communication receiver for configuring a Notch filter of the radio communication receiver according to yet an exemplifying embodiment.

An alternative exemplifying implementation of the radio communication receiver 300, 400 is illustrated in FIG. 4. FIG. 4 illustrates the radio communication receiver 400 comprising a retrieving unit 403 for retrieving stored and previously determined filter coefficients from a set of filter coefficients, where the retrieved filter coefficients constitute a fraction of the total number of filter coefficients; and a setting unit 404 for setting the rest of the filter coefficients to one. The radio communication receiver 400 further comprises a normalising unit 405 for normalising the retrieved filter coefficients; and a transforming unit 406 for transforming the filter coefficients such that the Notch position ends up at the one or more frequencies to be filtered out.

In FIG. 4, the radio communication receiver 400 is also illustrated comprising a communication unit 401. Through this unit, the radio communication receiver 400 is adapted to communicate with other nodes and/or entities in the wireless communication network. The communication unit 401 may comprise more than one receiving arrangement. For example, the communication unit 401 may be connected to both a wire and an antenna, by means of which radio communication receiver 400 is enabled to communicate with other nodes and/or entities in the wireless communication network. Similarly, the communication unit 401 may comprise more than one transmitting arrangement, which in turn is connected to both a wire and an antenna, by means of which the radio communication receiver 400 is enabled to communicate with other nodes and/or entities in the wireless communication network. The radio communication receiver 400 is further illustrated comprising a memory 402 for storing data. Further, the radio communication receiver 400 may comprise a control or processing unit (not shown) which in turn is connected to the different units 403-406. It shall be pointed out that this is merely an illustrative example and the radio communication receiver 400 may comprise more, less or other units or modules which execute the functions of the radio communication receiver 400 in the same manner as the units illustrated in FIG. 4.

It should be noted that FIG. 4 merely illustrates various functional units in the radio communication receiver 400 in a logical sense. The functions in practice may be implemented using any suitable software and hardware means/circuits etc. Thus, the embodiments are generally not limited to the shown structures of the radio communication receiver 400 and the functional units. Hence, the previously described exemplary embodiments may be realised in many ways. For example, one embodiment includes a computer-readable medium having instructions stored thereon that are executable by the control or processing unit for executing the method actions or steps in the radio communication receiver 400. The instructions executable by the computing system and stored on the computer-readable medium perform the method actions or steps of the radio communication receiver 400 as set forth in the claims.

The radio communication receiver has the same possible advantages as the method performed by the radio communication receiver. One possible advantage is that the computational complexity is reduced. A further possible advantage it may provide a strong tool for handling NBIR. Yet a further possible advantage is that it may provide a strong tool also for efficiently co-deploy two or more Radio Access Technologies, RATs in limited amount of spectrum, which may also be of significant interest in the future for e.g. operators with limited spectrum wanting to re-farm e.g. Global System for Mobile communication, GSM, spectrum to Wideband Code Division Multiple Access, WCDMA.

According to an embodiment, the radio communication receiver 300, 400 is further configured for converting the normalised filter coefficients from the frequency domain to the time domain.

According to yet an embodiment, the radio communication receiver 300, 400 is configured for performing the actions in order of (a) retrieving stored and previously determined filter coefficients, wherein the filter coefficients have been stored in the frequency domain, setting the rest of the filter coefficients to one, normalising the retrieved filter coefficients, converting the normalised filter coefficients from the frequency domain to the time domain, and transforming the filter coefficients in time domain; or (b) retrieving stored and previously determined filter coefficients, wherein the filter coefficients have been stored in the frequency domain, setting the rest of the filter coefficients to one, normalising the retrieved filter coefficients, transforming the filter coefficients in frequency domain and converting the normalised filter coefficients from the frequency domain to the time domain; or (c) retrieving stored and previously determined filter coefficients, wherein the filter coefficients have been stored in the time domain, setting the rest of the filter coefficients to one, normalising the retrieved filter coefficients, and transforming the filter coefficients.

According to still an embodiment, the radio communication receiver 300, 400 is configured for storing the set of previously determined filter coefficients in the time or frequency domain respectively.

According to a further embodiment, the radio communication receiver 300, 400 is configured for normalising the retrieved filter coefficients by normalising with regards to the notch depth and noise floor.

According to another embodiment, the radio communication receiver 300, 400 is further configured for retrieving one or more frequencies to be filtered out and the desired Notch depth.

According to an embodiment, the set of stored previously determined filter coefficients has been determined by solving a set of linear equations based on the conditions that the filter transfer function and its derivative are zero at a certain frequency, where the frequency differs between the filters in the set.

According to yet an embodiment, the set of stored previously determined filter coefficients have been determined by minimising the amount of energy passing through the Notch filter in a certain frequency range, and where the centre frequency of the frequency range differs between the filters in the set.

According to still an embodiment, the radio communication receiver 300, 400 is further configured for determining the frequency range with respect to width and centre position of the Notch filter.

According to a further embodiment, the retrieved filter coefficients corresponds to a stored filter with one or more specific centre frequencies equal to zero and where the size of the stored set of filters is one or larger.

According to another embodiment, the transforming of the filter coefficients depends on the number of filter harmonics and the periodicity of the Notch filter.

According to an embodiment, the radio communication receiver 300, 400 is further configured for retrieving the filter coefficients by also retrieving the filter coefficients from the set of pre-calculated filter coefficients corresponding to the centre frequency that is closest in frequency-distance to the absolute value of the distance between the desired position and the periodicity of the filter times the number of harmonics.

According to yet an embodiment, the radio communication receiver 300, 400 is configured for transforming the filter coefficients to achieve the desired Notch position by: determining a shift index as the number of harmonics; mirroring the filter coefficients around the centre coefficient if the distance between the desired position and the periodicity of the filter times the number of harmonics is negative; and circularly shifting the filter coefficients according to the shift index, wherein when the number of harmonics is negative the shift is to the left, whereas when the number of harmonics is positive the shift is to the right.

According to still an embodiment, the radio communication receiver 300, 400 is configured for transforming the filter coefficients to achieve the desired Notch position by adjusting the phase of the time-domain filter coefficients corresponding to the desired centre frequency position.

According to a further embodiment, the receiver is comprised in a radio base station or in a wireless device.

According to another embodiment, the number of retrieved stored and previously determined filter coefficients is at least two.

Figure 5:
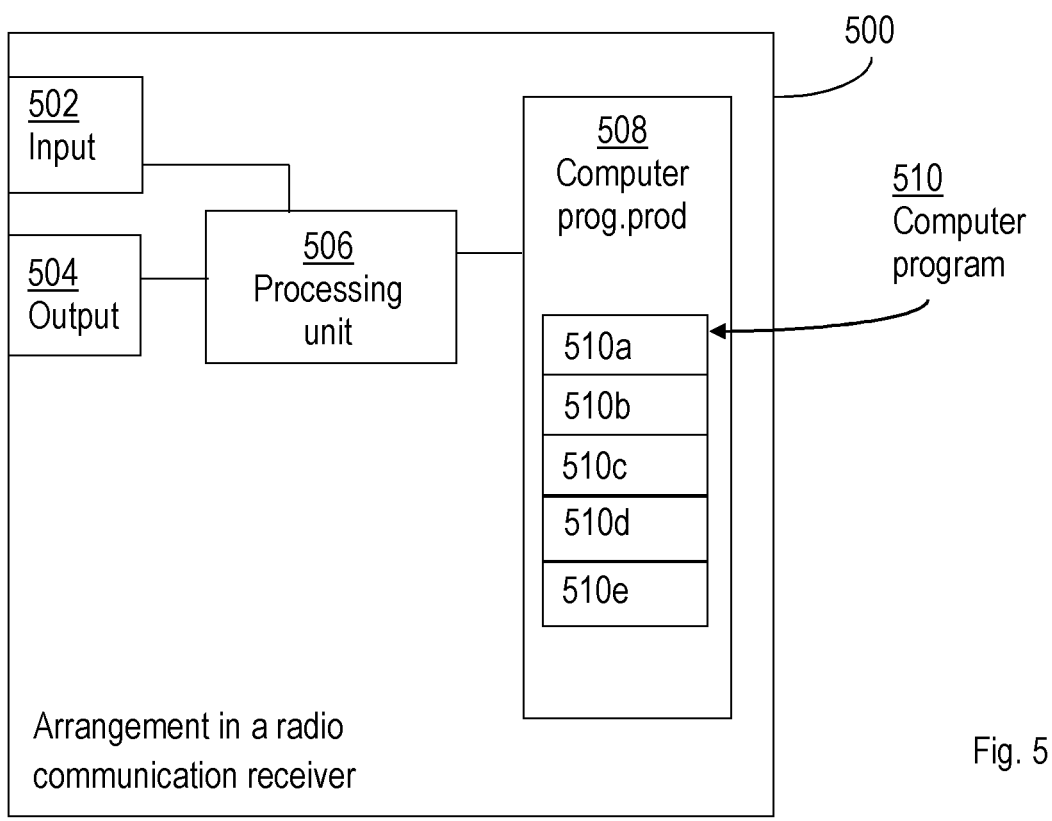
FIG. 5 is a block diagram of an arrangement in a radio communication receiver for configuring a Notch filter of the radio communication receiver according to an exemplifying embodiment.

FIG. 5 schematically shows an embodiment of an arrangement 500 in a radio communication receiver 400. Comprised in the arrangement 500 in the radio communication receiver 400 are here a processing unit 506, e.g. with a Digital Signal Processor, DSP. The processing unit 506 may be a single unit or a plurality of units to perform different actions of procedures described herein. The arrangement 500 of the radio communication receiver 400 may also comprise an input unit 502 for receiving signals from other entities, and an output unit 504 for providing signal(s) to other entities. The input unit and the output unit may be arranged as an integrated entity or as illustrated in the example of FIG. 4, as one or more interfaces 401.

Furthermore, the arrangement 500 in the radio communication receiver 400 comprises at least one computer program product 508 in the form of a non-volatile memory, e.g. an Electrically Erasable Programmable Read-Only Memory, EEPROM, a flash memory and a hard drive. The computer program product 508 comprises a computer program 510, which comprises code means, which when executed in the processing unit 506 in the arrangement 500 in the radio communication receiver 400 causes the radio communication receiver to perform the actions e.g. of the procedure described earlier in conjunction with FIGS. 1a-1d.

The computer program 510 may be configured as a computer program code structured in computer program modules 510a-510e. Hence, in an exemplifying embodiment, the code means in the computer program of the arrangement 500 in the radio communication receiver 400 comprises a retrieving unit, or module, for retrieving stored and previously determined filter coefficients from a set of filter coefficients, where the retrieved filter coefficients constitute a fraction of the total number of filter coefficients; and a setting unit, or module, for setting the rest of the filter coefficients to one. The computer program further comprises an normalising unit, or module, for normalising the retrieved filter coefficients; and a transforming unit, or module for transforming the filter coefficients such that the Notch position ends up at the one or more frequencies to be filtered out.

The computer program modules could essentially perform the actions of the flow illustrated in FIGS. 1a-1d, to emulate the radio communication receiver 400. In other words, when the different computer program modules are executed in the processing unit 506, they may correspond to the units 403-406 of FIG. 4.

Although the code means in the embodiments disclosed above in conjunction with FIG. 4 is implemented as computer program modules which when executed in the respective processing unit causes the radio communication receiver to perform the actions described above in the conjunction with figures mentioned above, at least one of the code means may in alternative embodiments be implemented at least partly as hardware circuits.

The processor may be a single Central Processing Unit, CPU, but could also comprise two or more processing units. For example, the processor may include general purpose microprocessors; instruction set processors and/or related chips sets and/or special purpose microprocessors such as Application Specific Integrated Circuits, ASICs. The processor may also comprise board memory for caching purposes. The computer program may be carried by a computer program product connected to the processor. The computer program product may comprise a computer readable medium on which the computer program is stored. For example, the computer program product may be a flash memory, a Random-Access Memory RAM, Read-Only Memory, ROM, or an EEPROM, and the computer program modules described above could in alternative embodiments be distributed on different computer program products in the form of memories within the radio communication receiver.

It is to be understood that the choice of interacting units, as well as the naming of the units within this disclosure are only for exemplifying purpose, and nodes suitable to execute any of the methods described above may be configured in a plurality of alternative ways in order to be able to execute the suggested procedure actions.

It should also be noted that the units described in this disclosure are to be regarded as logical entities and not with necessity as separate physical entities.

While the embodiments have been described in terms of several embodiments, it is contemplated that alternatives, modifications, permutations and equivalents thereof will become apparent upon reading of the specifications and study of the drawings. It is therefore intended that the following appended claims include such alternatives, modifications, permutations and equivalents as fall within the scope of the embodiments and defined by the pending claims.

The invention claimed is:

1. A method performed by a radio communication receiver for configuring a Notch filter of the radio communication receiver for filtering out one or more frequencies, the method comprising:

retrieving stored and previously determined filter coefficients from a set of filter coefficients, where the retrieved filter coefficients constitute a fraction of the set of filter coefficients;

setting the rest of the filter coefficients of the set of filter coefficients to one;

normalising the retrieved filter coefficients;

transforming the filter coefficients such that a Notch position filters one or more frequencies.

2. The method according to claim 1, wherein the method is performed in order of:

(a) retrieving the stored and previously determined filter coefficients, wherein the filter coefficients have been stored in a frequency domain, setting the rest of the filter coefficients to one, normalising the retrieved filter coefficients, converting the normalised filter coefficients from the frequency domain to a time domain, and transforming the filter coefficients in the time domain; or (b) retrieving the stored and previously determined filter coefficients, wherein the filter coefficients have been stored in the frequency domain, setting the rest of the filter coefficients to one, normalising the retrieved filter coefficients, transforming the filter coefficients in the frequency domain and converting the normalised filter coefficients from the frequency domain to the time domain; or (c) retrieving the stored and previously determined filter coefficients, wherein the filter coefficients have been stored in the time domain, setting the rest of the filter coefficients to one, normalising the retrieved filter coefficients, and transforming the filter coefficients.

3. The method according to claim 1, wherein the normalising the retrieved filter coefficients comprising normalising with regards to a notch depth and noise floor of the Notch filter.

4. The method according to claim 1, wherein the stored and previously determined filter coefficients have been determined by solving a set of linear equations based on conditions that a filter transfer function and its derivative are zero at a certain frequency, where the certain frequency differs between filters in the set of filter coefficients.

5. The method according to claim 1, wherein the stored and previously determined filter coefficients have been determined by minimising an amount of energy passing through the Notch filter in a certain frequency range, and where a centre frequency of the frequency range differs between the filters in the set of filter coefficients.

6. The method according to claim 1, where the retrieved stored and previously determined filter coefficients correspond to a filter with one or more specific centre frequencies equal to zero and where a size of the stored set of filter coefficients is one or larger.

7. The method according to claim 1, wherein the transforming of the filter coefficients depends on a number of filter harmonics and a periodicity of the Notch filter.

8. The method according to claim 1, wherein the retrieving the stored and previously determined filter coefficients further comprising retrieving the filter coefficients from a set of pre-calculated filter coefficients corresponding to a centre frequency that is closest in frequency-distance to an absolute value of a distance between a selected position and a periodicity of the Notch filter times a number of harmonics.

9. The method according to claim 1, wherein the transforming the filter coefficients to achieve the Notch position further comprises:

determining a shift index as a number of harmonics;

mirroring the filter coefficients around a centre coefficient if a distance between the Notch position and a periodicity of the Notch filter times the number of harmonics is negative;

circularly shifting the filter coefficients according to the shift index, wherein when the number of harmonics is negative a shift is to the left, whereas when the number of harmonics is positive the shift is to the right.

10. The method according to claim 1, wherein the transforming the filter coefficients to achieve the Notch position further comprises adjusting a phase of time-domain filter coefficients corresponding to a selected centre frequency position.

11. A radio communication receiver for configuring a Notch filter of the radio communication receiver to filter one or more frequencies, the radio communication receiver being configured to:

retrieve stored and previously determined filter coefficients from a set of filter coefficients, where the retrieved filter coefficients constitute a fraction of the set of filter coefficients;

set the rest of the filter coefficients of the set of filter coefficients to one;

normalise the retrieved filter coefficients;

transform the filter coefficients such that a Notch position filters one or more frequencies.

12. The radio communication receiver according to claim 11, further configured to perform in order to:

(a) retrieve the stored and previously determined filter coefficients, wherein the filter coefficients have been stored in a frequency domain, set the rest of the filter coefficients to one, normalise the retrieved filter coefficients, convert the normalised filter coefficients from the frequency domain to a time domain, and transform the filter coefficients in the time domain; or (b) retrieve the stored and previously determined filter coefficients, wherein the filter coefficients have been stored in the frequency domain, set the rest of the filter coefficients to one, normalise the retrieved filter coefficients, transform the filter coefficients in the frequency domain and convert the normalised filter coefficients from the frequency domain to the time domain; or (c) retrieve the stored and previously determined filter coefficients, wherein the filter coefficients have been stored in the time domain, set the rest of the filter coefficients to one, normalise the retrieved filter coefficients, and transform the filter coefficients.

13. The radio communication receiver according to claim 11, configured to normalise the retrieved filter coefficients by normalising with regards to a notch depth and noise floor of the Notch filter.

14. The radio communication receiver according to claim 11, wherein the stored and previously determined filter coefficients have been determined by solving a set of linear equations based on conditions that a filter transfer function and its derivative are zero at a certain frequency, where the certain frequency differs between the filters in the set of filter coefficients.

15. The radio communication receiver according to claim 11, wherein the stored and previously determined filter coefficients have been determined by minimising an amount of energy passing through the Notch filter in a certain frequency range, and where a centre frequency of the frequency range differs between the filters in the set of filter coefficients.

16. The radio communication receiver according to claim 11, wherein the retrieved stored and previously determined filter coefficients correspond to a filter with one or more specific centre frequencies equal to zero and where a size of the stored set of filter coefficients is one or larger.

17. The radio communication receiver according to claim 11, wherein to transform the filter coefficients depends on a number of filter harmonics and a periodicity of the Notch filter.

18. The radio communication receiver according to claim 11, further configured to retrieve the stored and previously determined filter coefficients from a set of pre-calculated filter coefficients corresponding to a centre frequency that is closest in frequency-distance to an absolute value of a distance between a selected position and a periodicity of the Notch filter times a number of harmonics.

19. The radio communication receiver according to claim 11, when configured to transform the filter coefficients to achieve the Notch position, the radio communication receiver is further configured to:
  determine a shift index as a number of harmonics;
  mirror the filter coefficients around a centre coefficient if a distance between the Notch position and a periodicity of the Notch filter times the number of harmonics is negative; and
  circularly shift the filter coefficients according to the shift index, wherein when the number of harmonics is negative a shift is to the left, whereas when the number of harmonics is positive the shift is to the right.

20. The radio communication receiver according to claim 11, when configured to transform the filter coefficients to achieve the Notch position, the radio communication receiver is further configured to adjust a phase of time-domain filter coefficients corresponding to a selected centre frequency position.

* * * * *